(12) United States Patent
Jung

(10) Patent No.: US 10,044,021 B2
(45) Date of Patent: Aug. 7, 2018

(54) PROTECTIVE CIRCUIT MODULE, AND BATTERY MODULE COMPRISING SAME

(71) Applicant: Tyco Electronics AMP Korea Ltd, Gyungsangbuk-do (KR)

(72) Inventor: Je Yoo Jung, Gyungsangbuk-Do (KR)

(73) Assignee: Tyco Electronics AMP Korea Ltd., Gyungsangbuk-do (KR)

( * ) Notice: Subject to any disclaimer, the term of this patent is extended or adjusted under 35 U.S.C. 154(b) by 137 days.

(21) Appl. No.: 14/752,831

(22) Filed: Jun. 26, 2015

(65) Prior Publication Data

US 2015/0303446 A1   Oct. 22, 2015

Related U.S. Application Data

(63) Continuation of application No. PCT/KR2013/008362, filed on Sep. 16, 2013.

(30) Foreign Application Priority Data

Dec. 27, 2012  (KR) .......................... 10-2012-0154548

(51) Int. Cl.
*H01M 2/34* (2006.01)
*H05K 7/06* (2006.01)
(Continued)

(52) U.S. Cl.
CPC ........... *H01M 2/348* (2013.01); *H01M 2/024* (2013.01); *H01M 2/34* (2013.01); *H01M 10/4257* (2013.01); *H01M 10/48* (2013.01); *H02H 3/38* (2013.01); *H02J 7/0031* (2013.01); *H05K 7/06* (2013.01); *H01M 2/1061* (2013.01); *H01M 2200/00* (2013.01); *H01M 2200/103* (2013.01); *H01M 2220/20* (2013.01); *H02J 2007/0039* (2013.01)

(58) Field of Classification Search
None
See application file for complete search history.

(56) References Cited

U.S. PATENT DOCUMENTS

2003/0231482 A1   12/2003  Naimi et al.
2004/0012396 A1   1/2004   Batson
(Continued)

FOREIGN PATENT DOCUMENTS

JP   2012059663 A   3/2012
JP   2012174507 A   9/2012
(Continued)

OTHER PUBLICATIONS

European Search Report, dated Aug. 17, 2016, 15 pages.
(Continued)

*Primary Examiner* — Jonathan G Leong
*Assistant Examiner* — Christopher P Domone
(74) *Attorney, Agent, or Firm* — Barley Snyder

(57) ABSTRACT

A protection circuit module has a substrate; a signal receiving connection terminal mounted on the substrate; a circuit portion mounted on the substrate, and electrically connected to signal receiving connection terminal; a first cover positioned over a first side of the substrate; and a second cover positioned over an opposite second side of the substrate, and into which the substrate is positioned.

18 Claims, 11 Drawing Sheets

(51) Int. Cl.
*H02J 7/00* (2006.01)
*H02H 3/38* (2006.01)
*H01M 10/48* (2006.01)
*H01M 2/02* (2006.01)
*H01M 10/42* (2006.01)
*H01M 2/10* (2006.01)

(56) References Cited

U.S. PATENT DOCUMENTS

| | | | | |
|---|---|---|---|---|
| 2005/0019654 | A1* | 1/2005 | Kishida | H01M 2/1044 |
| | | | | 429/178 |
| 2009/0110964 | A1* | 4/2009 | Dobata | H01M 2/0404 |
| | | | | 429/7 |
| 2009/0253027 | A1 | 10/2009 | Yang et al. | |
| 2010/0209761 | A1* | 8/2010 | Koh | H01M 2/0207 |
| | | | | 429/162 |
| 2011/0013370 | A1* | 1/2011 | Oota | H01L 23/42 |
| | | | | 361/752 |
| 2011/0148191 | A1 | 6/2011 | Nakamura et al. | |

FOREIGN PATENT DOCUMENTS

| | | | |
|---|---|---|---|
| JP | 2012221844 | A | 11/2012 |
| KR | 20120108260 | A | 10/2012 |

OTHER PUBLICATIONS

PCT International Search Report, International Application No. PCT/KR2013/008362, dated Jan. 6, 2014, 2 pages.
Abstract of JP2012221844, dated Nov. 12, 2012, 1 page.
Abstract of JP2012059663, dated Mar. 22, 2012, 1 page.
Abstract of KR20120108260, dated Oct. 5, 2012, 1 page.
Abstract of JP2012174507, dated Sep. 10, 2012, 1 page.

* cited by examiner

PROTECTIVE CIRCUIT MODULE, AND BATTERY MODULE COMPRISING SAME

CROSS-REFERENCE TO RELATED APPLICATION

This application is a continuation of International Patent Application No. PCT/KR2013/008362 filed Sep. 16, 2013, which claims priority under 35 U.S.C. § 119 to Korean Patent Application No. 10-2012-0154548 filed Dec. 27, 2012.

FIELD OF THE INVENTION

The invention is generally related to a protection circuit module, and, more specifically, to a battery module having a protection circuit module.

BACKGROUND

Conventional secondary battery modules are designed such that a plurality of cells is connected in series or in parallel and outputs predetermined voltage. The performance of each cell affects the performance of the battery module, largely, the performance of a battery pack coupled with the battery module. Thus, voltage or current of each battery cell is to be measured in order to measure the performance of each battery cell. To this end, a current measuring module is mounted within the secondary battery module to measure the voltage or the current.

Electrical signals gathered by the current measuring module are transferred to a battery management system (BMS) through an external output terminal, and are used to measure the performance of each cell. In such a system, a cell is directly connected to the BMS in which cells manage all of the batteries.

Abnormal chemical reactions or external impact forces may cause overcurrent and overvoltage in a cell. In these cases, the overcurrent and the overvoltage may affect the BMS directly connected to cells, thereby leading to damage the BMS.

To prevent damage to the BMS, there is a need for a method that can protect the entire system from a malfunctioning operation of a battery, such as overcurrent and overvoltage occurring in a battery cell, by providing a protection circuit module.

SUMMARY

A protection circuit module has a substrate; a signal receiving connection terminal mounted on the substrate; a circuit portion mounted on the substrate, and electrically connected to signal receiving connection terminal; a first cover positioned over a first side of the substrate; and a second cover positioned over an opposite second side of the substrate, and into which the substrate is positioned.

BRIEF DESCRIPTION OF DRAWINGS

The invention will now be described by way of example, with reference to the accompanying Figures, of which.

DETAILED DESCRIPTION OF THE EMBODIMENT(S)

A protection circuit module and a battery module will be described with reference to FIGS. 1-9.

Figure 1:
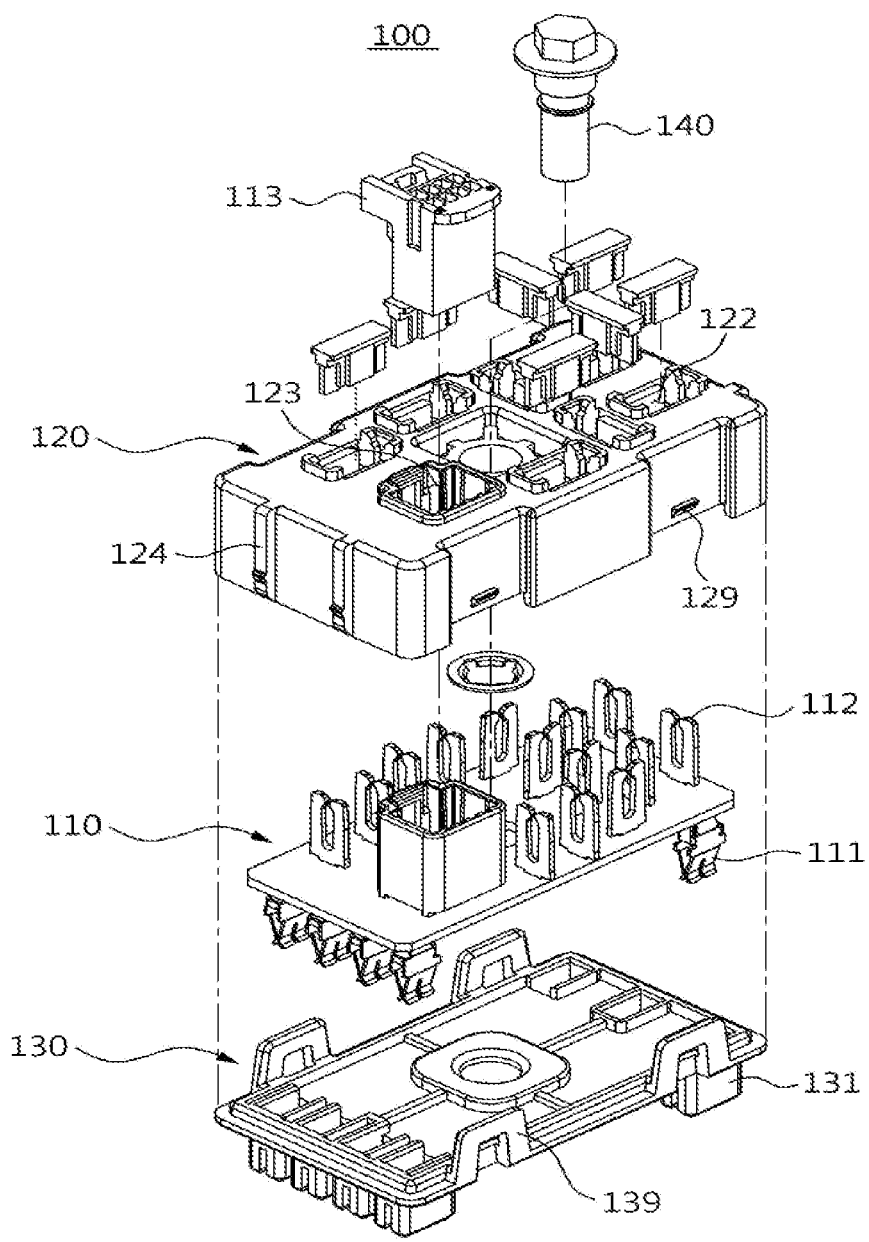
FIG. 1 is an exploded perspective view of a protection circuit module.

In an embodiment shown in FIG. 1, a protection circuit module 100 has a substrate 110, a first cover 120, and a second cover 130. In an embodiment, a connection terminal 111 and a circuit portion 112 are mounted on the substrate 110. Hereinafter, for ease of description, the description will be made based on an embodiment in which the circuit portion 112 is a fuse. However, the embodiment is not limited thereto and further various descriptions related thereto are made below.

The substrate 110 is positioned on an upper surface of the second cover 130, and the first cover 120 covers one surface, such as an upper surface, of the substrate 110. At the same time, the second cover 130 covers an opposite surface, such as a lower surface, of the substrate 110. Accordingly, the substrate 100 and primary circuits or parts mounted on the substrate 100 are protected. In addition, the first cover 120 and the second cover 130 have a complimentary coupling mechanism for mutual coupling each to the other.

The connection terminal 111 and the fuse 112 can be directly or indirectly mounted on the substrate 110. In an embodiment (not shown), the connection terminal 111 is directly mounted on the substrate 110, and the fuse 112 is indirectly mounted on the substrate 110 through a fuse terminal directly mounted on the substrate 110. In an embodiment shown in FIGS. 1-2B, the fuse 112 and the connection terminal 111 are separately mounted on the substrate 110. The fuse 112 is mounted on an upper surface of the substrate 110, and the connection terminal 111 is mounted on an opposite lower surface of the substrate 110. However, those of ordinary skill in the art would appreciate that the fuse 112 and the connection terminal 111 may be mounted on either the upper surface or the lower surface.

A fuse receiving passageway 122 for mounting and replacing the fuse 112 is disposed through the first cover 120, and a connection terminal receiving housing 131 for receiving and protecting the connection terminal 111 is positioned on the second cover 130, which will be described below.

Figure 2A:
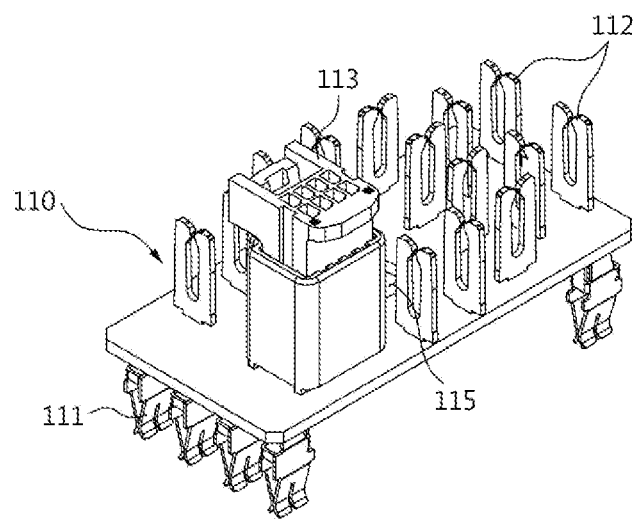
FIG. 2A is a perspective view of an upper surface of a substrate.
Figure 2B:
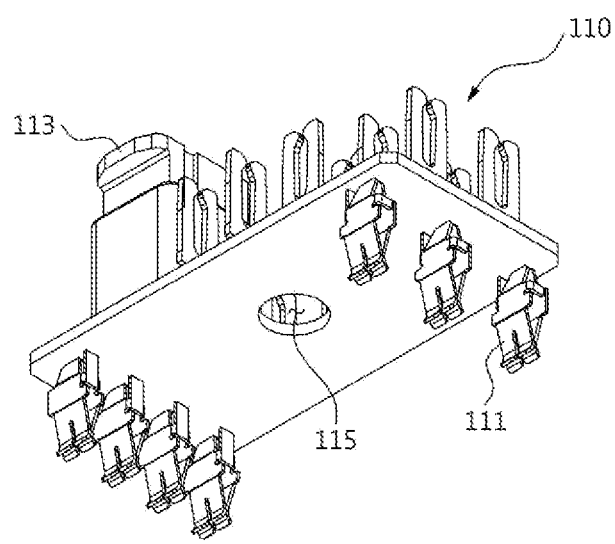
FIG. 2B is a perspective view of a lower surface of the substrate.

In the embodiments shown in FIGS. 2A and 2B, the substrate 110 is a general printed circuit board (PCB), and the connection terminal 111 and the fuse 112 are mounted on the substrate 110. In the shown embodiment, the connection terminal 111 and the fuse 112 are separately mounted on opposite surfaces of the substrate 110, although those of ordinary skill in the art would appreciate that the connection terminal 111 and fuse 112 can be mounted on the same surface or on different surfaces.

The connection terminal 111 corresponds to a cell lead and/or a sensing module of a battery module, and may receive an electrical signal of each cell from the cell lead and/or the sensing module and may configure a cell signal connector. Also, in correspondence thereto, a cell lead, a sensing module 170, and tabs 165 and 175 (described below with reference to FIG. 7A) may transmit an electrical signal of a cell and thus, may configure a cell signal output portion. A plurality of connection terminals 111 can be provided, each having a pair of elastic grasping arms that exert an elastic force towards each other when the grasping arms have been displaced apart. In another embodiment (not shown), a single connection terminal 111 can be divided into a plurality of grasping arms. When cell leads are formed bi-directionally, and when the number of cells is 2n, n connection terminals 111 may be positioned on one surface and (n+1) connection terminals 111 be provided on the other surface. In the embodiment shown in FIG. 2B, 6 cells are provided, where three connection terminals 111 are on one surface and four connection terminal 111 are be provided on the other surface.

The fuse 112 serves to electrically connect the cell lead and/or the sensing module to the connection terminal 111. Accordingly, when an abnormal phenomenon such as overcurrent and overvoltage occurs in a cell, the fuse 112 short-circuits the electrical connection, protecting the entire system including a battery management system (BMS). The fuse 112 can provided based on a shape or a size of the substrate 110, and a contact point between the fuse 112 and the connection terminal 111 may not always make a one-to-one correspondence. For example, the fuses 112 may be aligned in both a longitudinal direction and a traverse direction on the substrate 110, which differs from the alignment of the connection terminals 111. Further, the fuse 112 may be a fuse widely used for vehicles, such as a blade-type fuse, a glass tube fuse, a Bosch type fuse, a fusible link, and a fuse limiter, or a semiconductor fuse.

As described above, the fuse 112 is one example of a circuit portion that constitutes a protection circuit module. In an embodiment, in addition to a fuse, the circuit portion 112 can be a relay by an electronic device, or a circuit breaker, such as an earth leakage circuit breaker, an electromagnetic circuit breaker, and a bimetal circuit breaker. Additionally, the circuit portion 112 can use a switch or a relay using a semiconductor of a metal-oxide semiconductor field effect transistor (MOSFET) and a non-contact switch such as a solid state replay (SSR). Further, the circuit portion 112 can have any combination of the aforementioned fuse 112, relay, switch, and circuit-breaker.

In an embodiment, instead of protecting an entire battery module using the electrical short-circuit, the circuit portion 112 can achieve the stability of a battery module in a different manner. For example, a voltage stabilization circuit, a voltage signal transceiving circuit, a circuit for switching ON/OFF a connection point of each cell, and a temperature/data emission circuit can constitute the circuit portion 112, and thereby be provided to the substrate 110 or the battery module to protect the battery module.

The circuit portion 112 can be electrically connected to the cell signal output portion by contacting, such as contact through a contact point, with the cell signal output portion, such as through the tabs 165 and 175). The contact point is located inside the protection circuit module 100 to prevent the short-circuit of the contact point from occurring due to external effects, and to maintain the electrical connection between the circuit portion 112 and the cell signal output portion, thereby stably operating the entire system.

Figure 3:
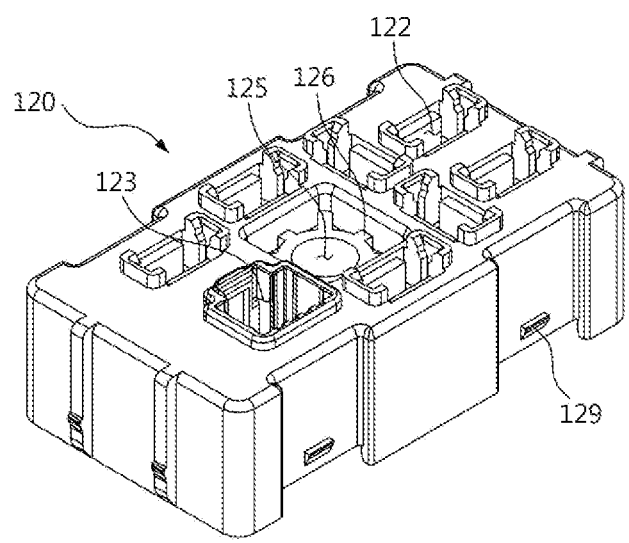
FIG. 3 is a perspective view of a first cover.
Figure 4A:
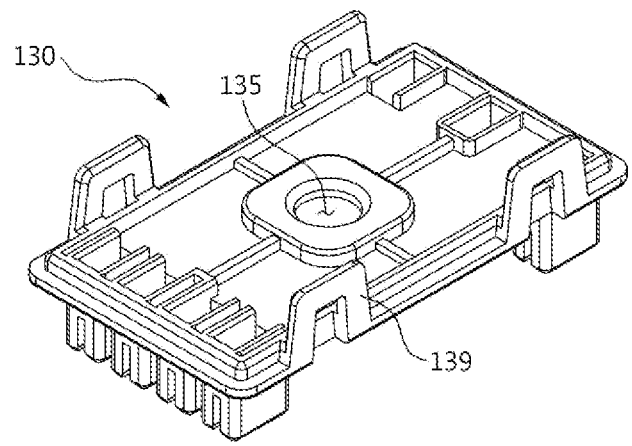
FIG. 4A is a perspective view of an upper surface of a second cover.
Figure 4B:
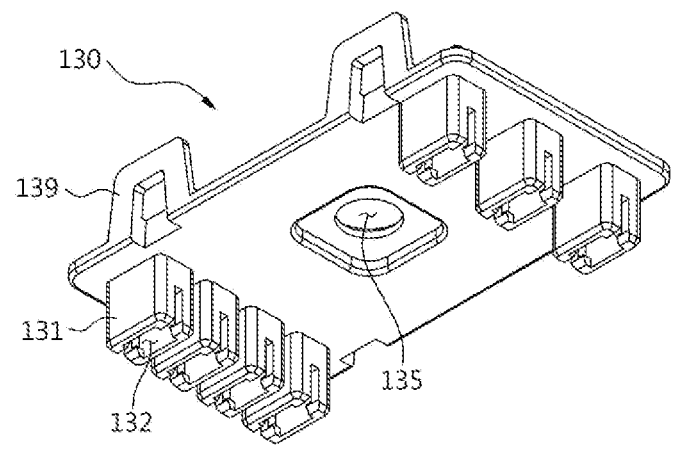
FIG. 4B is a perspective view of a lower surface of the second cover.

FIG. 3 shows an embodiment of the first cover 120, and FIGS. 4A and 4B shows embodiments of the second cover 130. As described above, the first cover 120 can cover one surface of the substrate 110 and the second cover 130 can cover the other surface of the substrate 110, thereby protecting the substrate 110. In such a manner, the first cover 120 and the second cover 130 form a single circuit case that receives the substrate 110 therein. The circuit case can protect the substrate 110 from an outside and may be separable if necessary, thereby enabling each part to be easily repairable or replaceable. Although the first cover 120 and the second cover 130 together form the circuit case, it is only an example and thus, various modifications and changes may be made to the circuit case.

A first slot for an outside interface is formed on a upper surface of the circuit case, and a second slot for receiving an electrical signal of a battery module may be formed on a lower surface of the circuit case. The first slot may be embodied as a circuit portion receiving slot 122 and a data connector receiving slot 123, and the second slot may be embodied as a guide slot 132 and a connection terminal hole 152, which will be described below.

When an abnormal phenomenon such as overcurrent and overvoltage of a cell is detected from the cell lead and/or the sensing module, the protection circuit module 100, particularly the fuse 112, may protect the entire system including the BMS. Thus, it is possible to minimize the damage to a part even under an abnormal condition and to operate the system without burdening the entire system. In addition, it is possible to exclude an operation such as welding or soldering by modularizing a protection circuit as above. Accordingly, it is possible to further easily assemble the protection circuit to the battery module and to easily detach the protection circuit from the battery module based on a purpose, such as a repair or a replacement.

The first cover 120 and the second cover 130 have a locking mechanism for connecting together, and may couple with each other based on the substrate 110. A description related thereto will be made by referring again to the embodiment of FIG. 1. A protrusion 129 is positioned on the first cover 120, and a corresponding protrusion receiving tongue 139 is formed on the second cover 130 at a location corresponding to a location of the protrusion 129 of the first cover 120. The protrusion receiving tongue 139 has a protrusion receiving space (not labeled) centrally positioned thereon. Upon coupling the first cover 120 with the second cover 130, the protrusion 129 is positioned in the protrusion receiving space and is coupled with the protrusion receiving tongue 139 in a snap-fit manner. A state in which the protrusion 129 and the protrusion receiving tongue 139 are coupled with each other can be seen in the embodiments shown in FIGS. 7A and 7B. The first cover 120 and the second cover 130 are thus coupled with each other, and thereby protect the substrate 110 therein, permitting use in a vibrating environment such as a vehicle.

In an embodiment, the protection circuit module 100 further includes a fastener 140. The fastener 140 penetrates and thereby couples the first cover 120, the substrate 110, and the second cover 130. The fastener 140 can simultaneously be used together with the locking mechanism of the first cover 120 and the second cover 130, thereby further improving the secureness of the protection circuit module 100. In an embodiment, the fastener 140 is bolt and a nut. However, those of ordinary skill in the art would appreciate that the embodiment is not limited thereto, and that other fastener types can also be used. When the fastener 140 penetrates and thereby couples the respective members, a single fastener 140 can be used to penetrate the center of the respective members. When a plurality of fasteners is used at different locations instead of the center of each member, the fastening force may be out of balance. Accordingly, the balance may be maintained and the cell lead and/or the sensing module may be connected with the connection terminal 111 at a time by making the fastener 140 penetrate the center of and thereby couple the members.

Fastener receiving holes 125, 115, and 135 are formed on the first cover 120, the substrate 110, and the second cover 130, respectively. A plurality of ribs may be provided on at least one of the fastener receiving holes 125, 115, and 135. A description related thereto will be made with reference to FIG. 3. Referring to FIG. 3, a plurality of ribs 126 is formed in a radial form along the periphery of the fastener receiving hole 125 formed on the first cover 120, thereby supporting the fastener 140. Accordingly, it is possible to prevent the first cover 120 from being damaged due to the fastening force of the fastener 140. Although the present embodiment describes that the plurality of ribs 126 is provided only to the fastener receiving hole 125 of the first cover 120, this is only exemplary and is not limiting. Also, a supporting structure using the same method may be applied to the fastener receiving hole 115 of the substrate 110 and the fastener receiving hole 135 of the second cover 130.

As shown in the embodiments of FIGS. 1, 2A, and 2B, a data connector 113 is mounted on the substrate 110 to transmit cell information to an external system. The data connector 113 is positioned in the data connector receiving slot 123 on the first cover 120, and it connected to the substrate 110. Accordingly, it is possible to easily repair and replace the data connector 113.

Similarly, the fuse receiving passageway 122 is formed on the first cover 120. The fuse 112 is inserted through the fuse receiving passageway 122 and is connected to the substrate 110. Therefore repair and replacement may be easily performed by individually disconnecting and removing the fuse 112.

In the embodiments shown in FIGS. 4A and 4B, the connection terminal receiving housing 131 is formed on the second cover 130. The connection terminal receiving housing 131 has a complimentary shape corresponding to the connection terminal 111, with the connection terminal 111 being positioned thereon to protect the connection terminal 111 from external impact and dust. As described above, since the connection terminal 111 is coupled with the cell lead and/or the sensing module and receives an electrical signal of a cell, the guide slot 132 for coupling the connection terminal 111 with the cell lead and/or the sensing module is formed on one side of the connection terminal receiving housing 131.

Hereinafter, the battery module including the aforementioned protection circuit module 100 will be described. In an embodiment, the battery module has a support 150 in addition to the protection circuit module 100.

Figure 5:
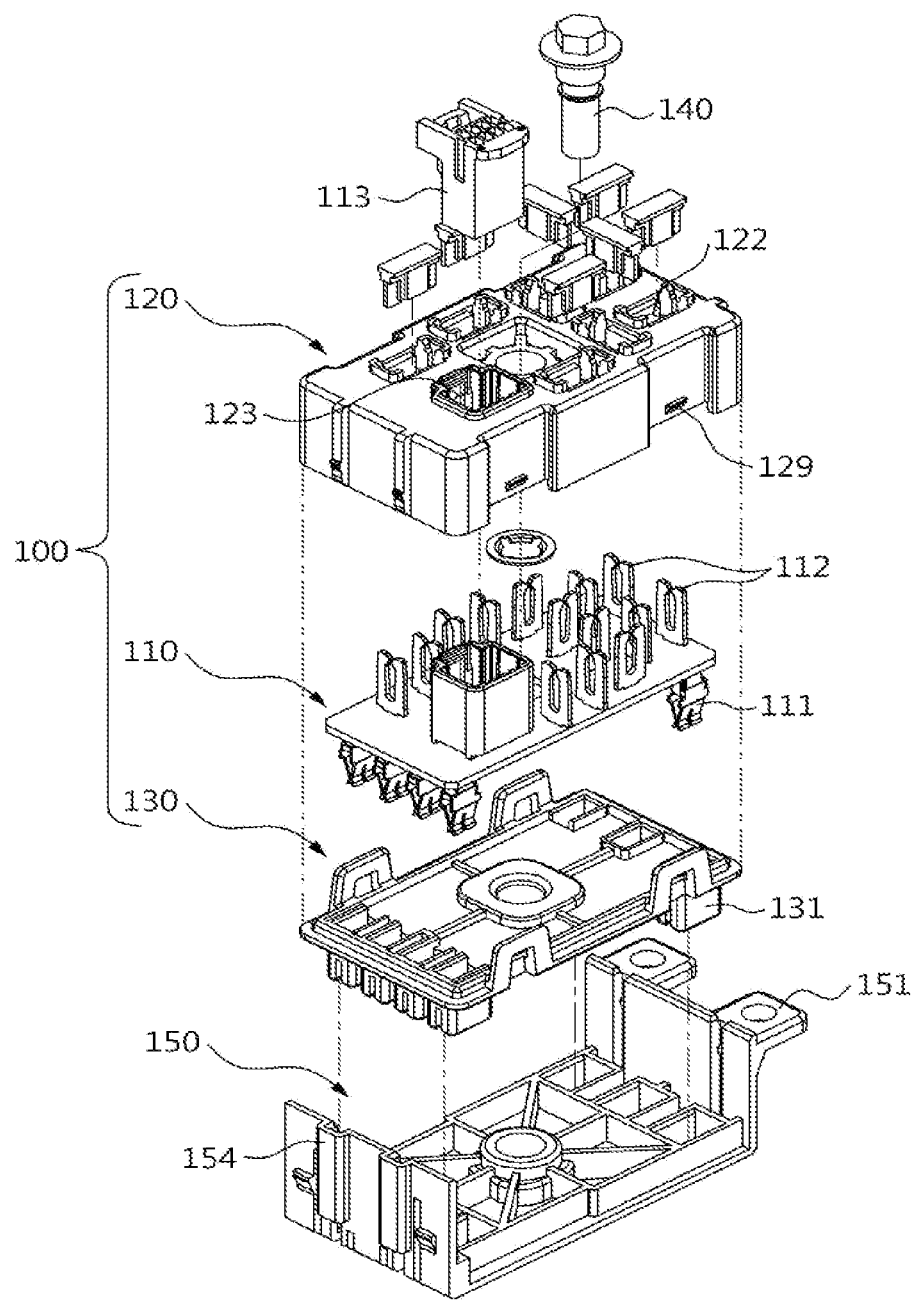
FIG. 5 is an exploded perspective view of the protection circuit module and the support.

In the embodiment of FIG. 5, the protection circuit module 100 and a support 150 are shown. For ease of description, in FIGS. 5, 6A, 6B, 7A, and 7B, a battery module frame is omitted, and the protection circuit module 100 and the support 150 are configured as a single module. However, without being limited thereto, the protection circuit module 100 is provided as illustrated in FIGS. 8A and 8B, and the support 150 is separately coupled with a battery module frame 1. A detailed description related thereto will be made below.

Referring to FIG. 5, the protection circuit module 100 is positioned on an upper surface of the support 150. At the same time, the support 150 is coupled with a battery module frame. That is, the support 150 may serve to fix the protection circuit module 100 to the battery module frame. Since a fastener receiving hole 151 is positioned on the support 150, the support 150 can be coupled with the battery module frame using a fastener such as a bolt. In addition, the support 150 can be directly coupled at an actual application location in addition to the battery module frame. For example, when the protection circuit module 100 or the battery module is applied to a vehicle, the support 150 may be coupled with a box for vehicle within the vehicle.

In an embodiment, the support 150 surrounds at least a portion of the second cover 130. For example, a cross section of the support 150 is a curved structure and the support 150 surrounds the second cover 130 from both sides thereof and further supports the protection circuit module 100. Accordingly, when the protection circuit module 100 is positioned in the support 150, it is possible to provide a further enhanced stability. Although the protection circuit module 100 is used in a vibrating environment of, for example, a vehicle, a stable location of the protection circuit module 100, and a firm fastening/coupling state of the entire device is maintained. In addition, since the support 150 surrounds the second cover 130 or the protection circuit module 100 the second cover 130 or the protection circuit module 100 is protected from external impacts. The configuration can be applied alike to the aforementioned embodiments in which the circuit case is configured. That is, the support 150 can have a shape corresponding to a lower surface of the circuit case and can be designed in a shape to surround at least a portion of the circuit case.

In an embodiment, the battery module further includes the fastener 140 to achieve the fastening force of the protection circuit module 100 and the support 150, more particularly, the fastening force of the first cover 120, the substrate 110, the second cover 130, and the support 150. The fastener 140 penetrates and thereby couples the first cover 120, the substrate 110, the second cover 130, and the support 150 altogether. The fastener 140, simultaneously together with the coupler of the first cover 120 and the second cover 130, thereby further improves the stability of the battery module since the second cover 130 can be fixably pressed between the first cover 120 and the support 150. In an embodiment, when the fastener 140 is a bolt, the bolt fixes the protection circuit module 100 to the support 150 by penetrating through the first cover 120, the substrate 110, and the second cover 130, and by coupling with the nut provided on one side of the support 150. In an embodiment (not shown), an insulating layer is formed on the support 150 and the nut is formed on the insulating layer.

Additionally, the fastener 140 acts as an alignment guide during the coupling of the second cover 130 over the support 150. When the fastener 140, having penetrated the protection circuit module 100, is coupled with the support 150, the fastener 140 guides the second cover 130 into the appropriate coupling position, and more particularly, the protection circuit module 100 and thereby position and couple the second cover 130 in the support 150. In a reverse process, when separating the second cover 130 from the support 150, the fastener 140 is decoupled from the support 150, and is removed along with the second cover 130, which leads to separating the protection circuit module 100 from the support 150.

Meanwhile, in addition to penetrating and thereby coupling the first cover 120, the substrate 110, the second cover 130, and the support 150, the fastener 140 can directly couple the protection circuit module 100 to the battery module frame. When a bolt is used for the fastener 140, the fastener 140 can electrically connect the circuit portion 112 and the cell signal output portion by penetrating and thereby coupling the first cover 120, the substrate 110, the second cover 130, and the support 150, and at the same time, forming a contact point between the circuit portion 112 and the cell signal output portion. Through the above configuration, the protection circuit module 100 may slidably couple with the battery module frame.

In an embodiment, when the fastener 140 penetrates and couples the respective members, only a single fastener 140 is provided to penetrate the center of the respective members. For example, when a fastener receiving tab (described below) is provided, the fastener 140 may penetrate the center of a tab arrangement. When a plurality of fasteners is used at locations outside of the center of each member, the fastening force can become out of balance. Accordingly, by having the fastener 140 penetrate the center of and thereby couple the respective members, balance is maintained and the cell lead and/or the sensing module can be simultaneously connected with the connection terminal 111.

The fastener receiving holes 125, 115, 135, and 150 are formed on the first cover 120, the substrate 110, the second cover 130, and the support 150, respectively. A plurality of ribs 126 can optionally be provided on at least one of the fastener receiving holes 125, 115, 135, and 150. As shown in the embodiment of FIG. 3, the plurality of ribs 126 is radially formed along the periphery of the fastener receiving hole 125 on the first cover 120, thereby supporting the fastener 140. Accordingly, damage to the first cover 120 is prevented due to the fastening force of the fastener 140. A supporting structure using the same method may be applied to the fastener receiving hole 115 of the substrate 110, the fastener receiving hole 135 of the second cover 130, the fastener receiving hole 155 of the support 150.

In an embodiment (not shown), an insulating layer can be positioned between one end (a lower end) of the fastener 140 and the cell lead, thus providing an insulation distance therebetween. Accordingly, a short is prevented from occurring due to discharge. In an embodiment, the insulating layer is positioned on the support 150. When the protection circuit module 100 is positioned in or coupled with the support 150, the insulation distance is secured by locating the lower surface of the protection circuit module 100 on the insulating layer and by avoiding a direct contact with the cell lead. Further, the insulating layer is made of the same material as the support 150.

Figure 6A:
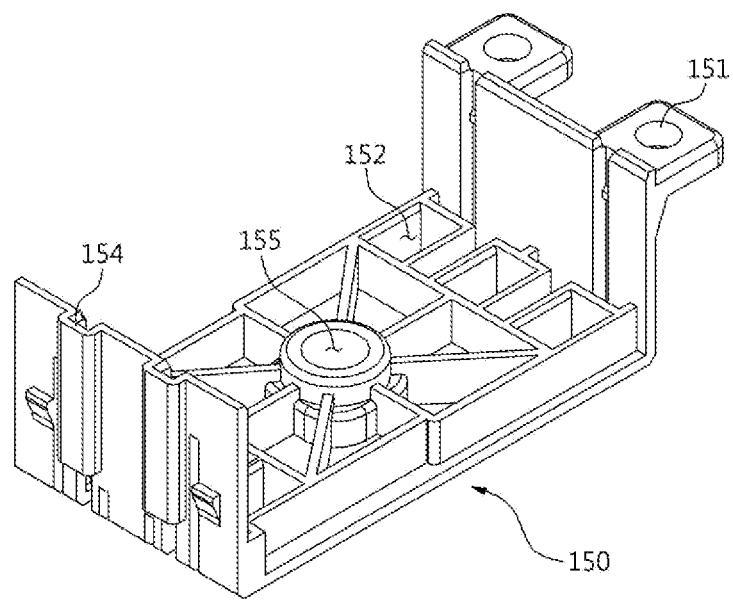
FIG. 6A is a perspective view of an upper surface of a support.
Figure 6B:
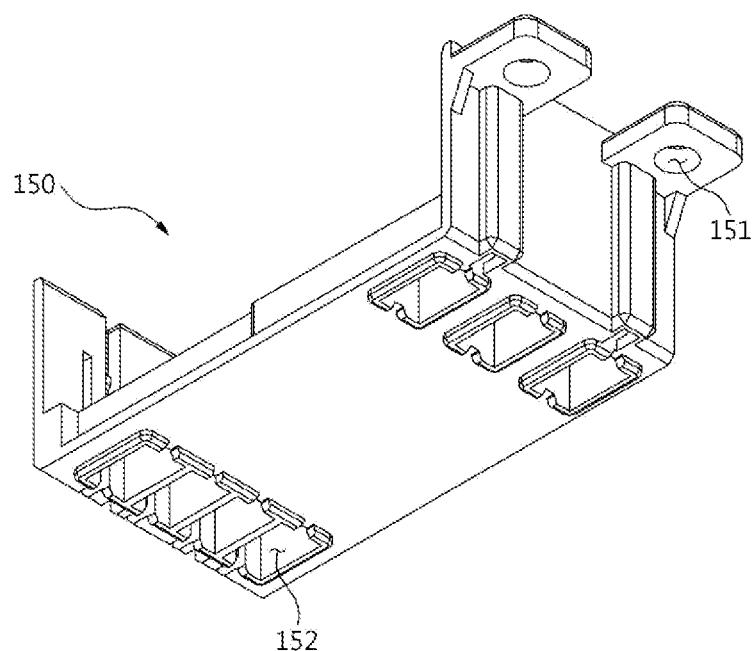
FIG. 6B is a perspective view of a lower surface of a support.

In the embodiments shown in FIGS. 6A and 6B the support 150 is coupled with the battery module frame through the fastener receiving hole 151. A groove-shaped guide portion corresponding to a second guide portion 154 is positioned on one side of the support 150 to guide and thereby receive the protection circuit module 100 in the support 150. Further, the connection terminal receiving hole 152 permits coupling of the connection terminal 111 of the protection circuit module 100 with the cell lead and/or the sensing module.

Figure 7A:
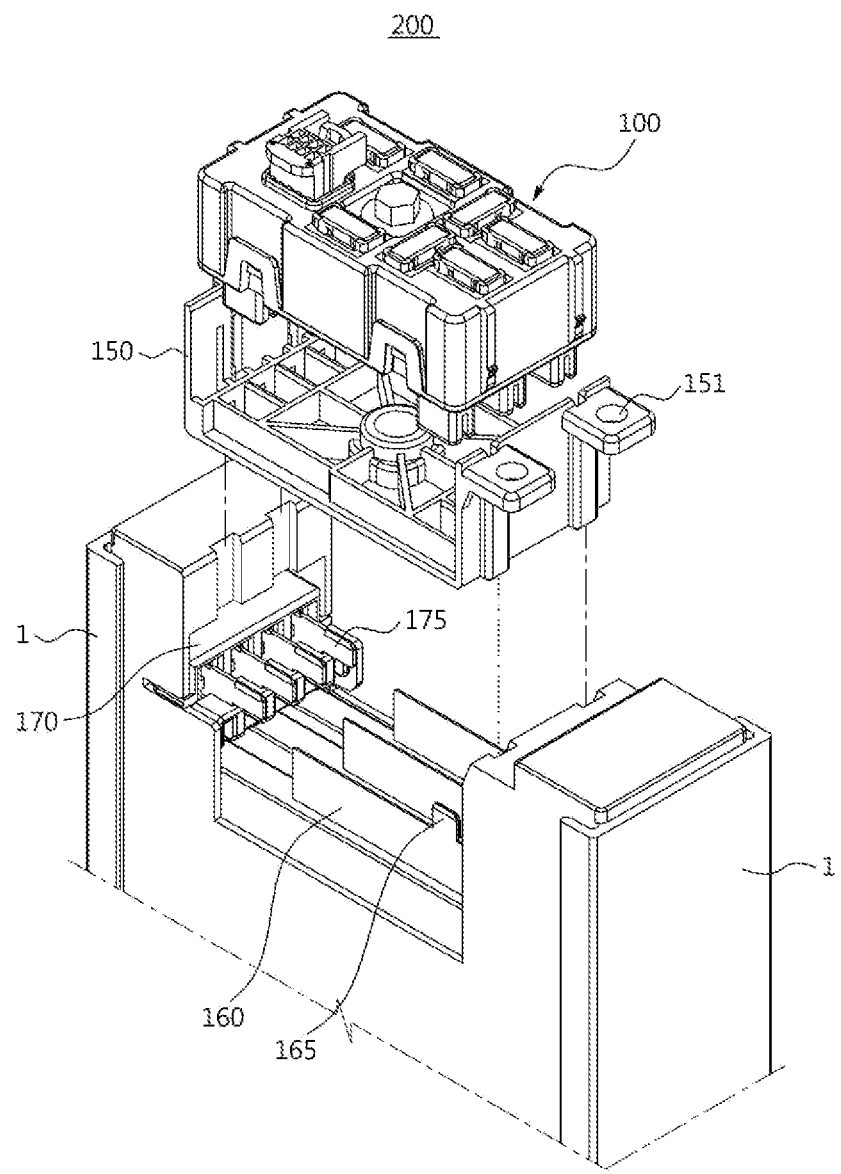
FIG. 7A is a perspective view of a first side of an unassembled battery module.
Figure 7B:
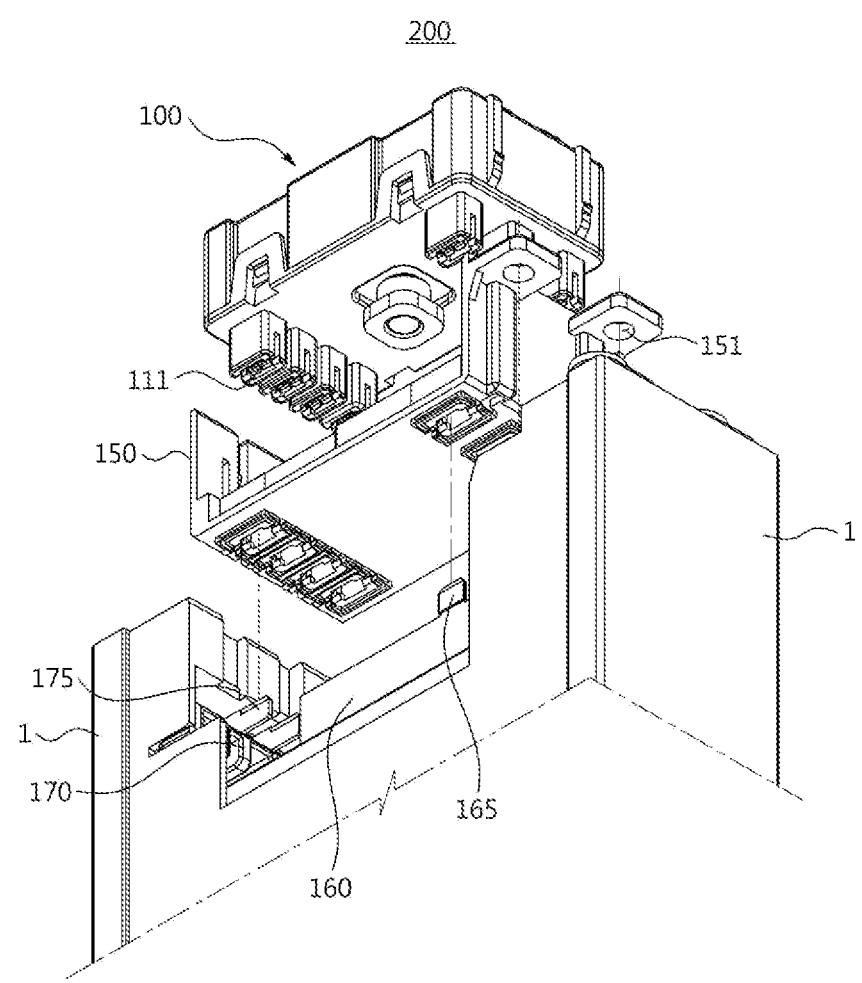
FIG. 7B is a perspective view of a second side of an unassembled battery module.
Figure 8A:
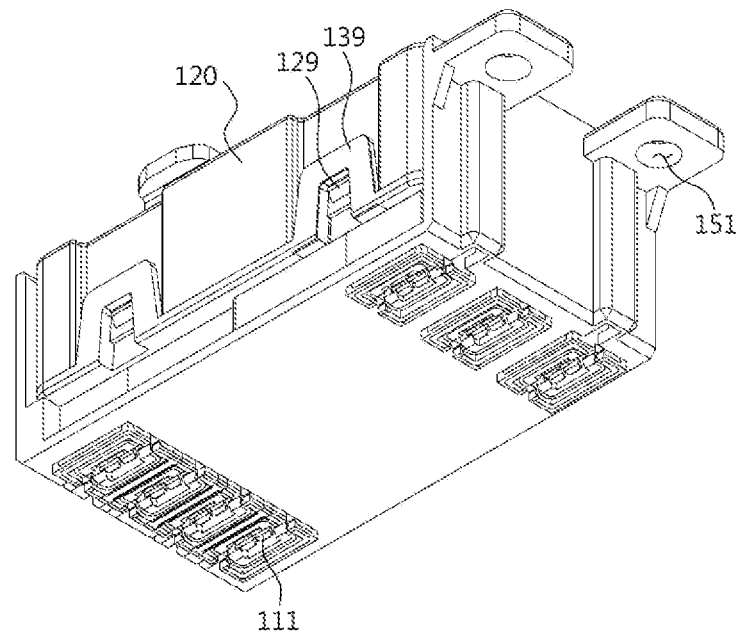
FIG. 8A is a perspective view of a lower side of the protection circuit module coupled to the support in FIGS. 6A and 6B.
Figure 8B:
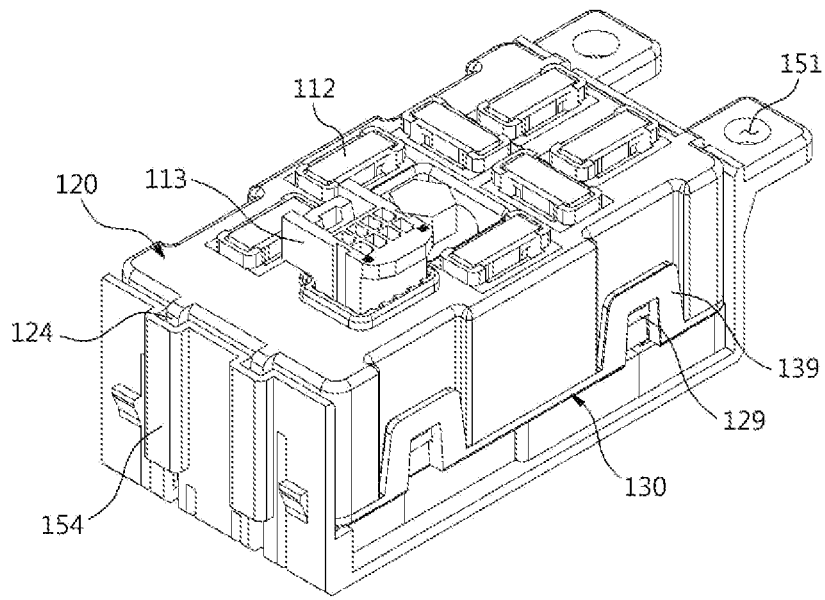
FIG. 8B is a perspective view of an upper side of the protection circuit module coupled to the support in FIGS. 6A and 6B.

In the embodiments shown in FIGS. 7A and 7B, a battery module 200 is in an unassembled state. Hereinafter, a description will be made based on a battery module in which cell leads are bi-directionally formed. However, a coupling method using a tab 165 may be applied to a battery module in which cell leads are formed in the same direction, in addition to the battery module in which the cell leads are bi-directionally formed. A description will be made based on an embodiment in which the tab 165 is positioned on a cell lead 160 and the tab 165 is coupled with the connection terminal 111. In an embodiment, and the tab 165 is formed on a bus-bar. For example, a separate bus-bar may be provided to the cell lead 160 and cell lead lines may be attached to both sides of the bus-bar and the tab 165 may be formed on one side of the bus-bar. The cell lead 160 disclosed herein includes the cell lead 160 itself, and the bus-bar provided to the cell lead 160.

The cell lead 160 and/or the sensing module 170 are provided to the battery module frame 1. As described above, the support 150 is fixably coupled with the battery module frame 1 through the fastener receiving hole 151 and the protection circuit module 100 is positioned in the support 150. In this instance, the fastener 140 penetrates and thereby couples the protection circuit module 100 and the support 150.

The tabs 165 and/or 175 are formed on the cell lead 160 and/or the sensing module 170, respectively. The tabs 165 and 175 are coupled with the connection terminal 111 mounted on the substrate 110 of the protection circuit module 100 and transmit an electrical signal of a cell to the connection terminal 111. According to the battery module 200, welding or soldering is not required and the battery module 200 are readily assembled and separated using the tabs 165 and 175.

Further, a tab 165 may be separately provided on one side of a battery module frame and the tab 165 or a cell lead 160 may be coupled with the connection terminal 111.

A state in which the connection terminal 111 and the tabs 165 and 175 are coupled will be described with reference to FIGS. 4A, 4B, 6A, and 6B. As described above, the connection terminal receiving housing 131 is formed on the second cover 130 of the protection circuit module 100, and the guide slot 132 for coupling the connection terminal 111 with the cell lead 160 and/or the sensing module 170 are formed on the connection terminal receiving housing 131. The connection terminal hole 152 is formed on the support 150 at a location corresponding to the connection terminal 111. Thus, without exposing the connection terminal 111, the cell lead 160 and/or the sensing module 170 can be connected through the connection terminal hole 152. The tab 165 of the cell lead 160 and/or the tab 175 of the sensing module 170 can connected to the connection terminal 111 through slidable coupling to transmit and receive an electrical signal.

Figure 7C:
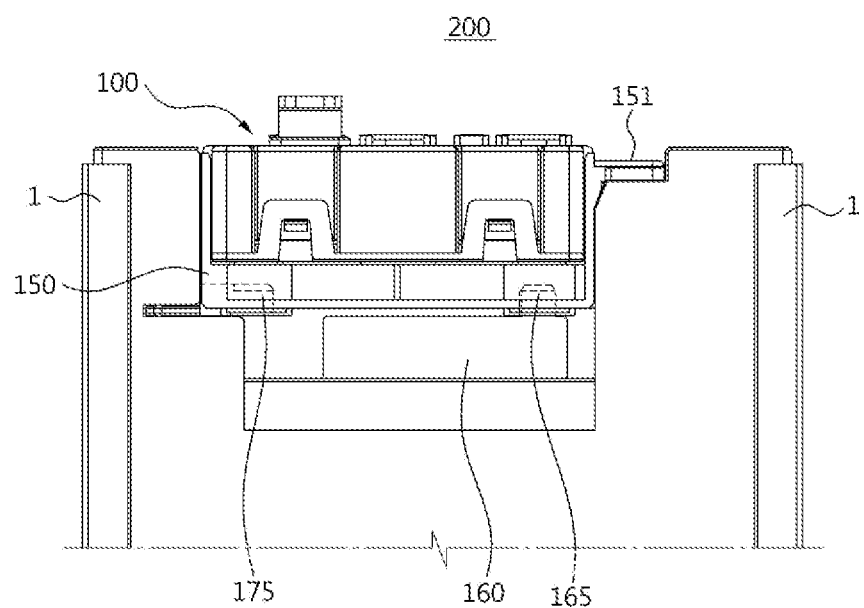
FIG. 7C is an elevation view of an assembled battery module.

In an embodiment FIG. 7C, the battery module 200 is shown in an assembled state. The tabs 165 and 175 of the cell lead 160 and/or the sensing module 170 are coupled with the connection terminal 111 of the protection circuit module 100. A location of each battery module 200 can firmly held in the assembled state and thus, the battery module 200 can remain firmly coupled under harsh conditions of, for example, a vehicle. In addition, a sensing signal is able to be stably transmitted to the BMS by preventing short-circuit of a contact point.

In the embodiments shown in FIGS. 8A and 8B, the protection circuit module 100 and the support 150 are coupled together. The protection circuit module 100 and the support 150 are easily coupled through the corresponding guide portions formed on the protection circuit module 100 and the support 150, respectively. For example, a first guide portion 124 is formed on one side of the first cover 120 of the protection circuit module 100, and a complimentarily-shaped second guide portion 154 is formed on one side of the support 150. The protection circuit module 100 is positioned in the support 150 in such a manner that the first guide portion 124 is guided by the second guide portion 154. An assembling direction of the protection circuit module 100 or the circuit case can be easily identified through the first and second guide portions 124 and 154. Also, assembly productivity is improved by enhancing an assembly speed. When the assembly is completed, the completeness and durability of assembly is additionally improved. In an embodiment (not shown), the first guide portion 124 can also be formed on one side of the second cover 130 and the second guide portion 154 can be formed on one side of the first cover 120.

Figure 9:
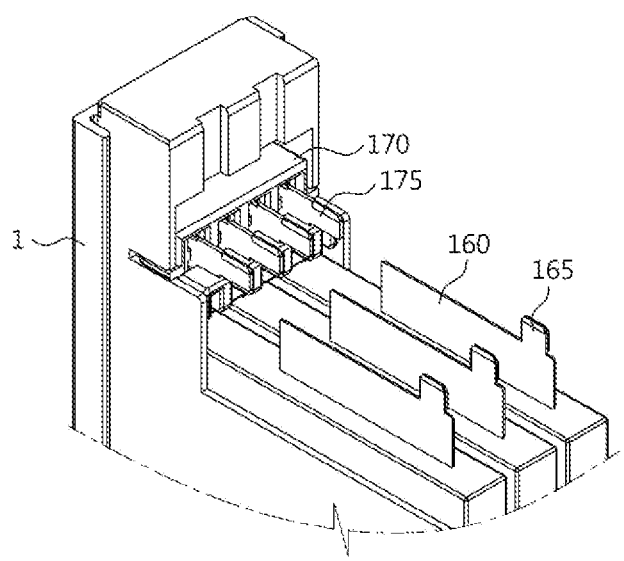
FIG. 9 is a perspective of a current measuring module.

In an embodiment of FIG. 9, the sensing module 170 has a tab 175 connected to the protection circuit module 100. The sensing module 170 is coupled with one side of the battery module frame 1. In an embodiment, the sensing module 170 is slidably coupled with one side of the battery module frame 1. For example, a protrusion receiving groove for the sensing module 170 may be positioned on the battery module frame 1, and a corresponding protrusion may be positioned on the sensing module 170, whereby the protrusion may be guided along protrusion receiving groove to thereby move the sensing module 170 to a predetermined location. At the location, a coupling device, such as a protrusion receiving tongue that is combinable with the protrusion, may be provided and coupled with the protrusion. In this manner, the sensing module 170 may be fixed to the battery module frame 1. In an embodiment, the sensing module 170 can be provided on one side of the protection circuit module 100. For example, the sensing module 170 can be directly connected to one side of the protection circuit module 100 through the tab 175 without being connected to the battery module frame 1. Alternatively, the sensing module 170 can be mounted on the substrate in the protection circuit module 100.

In the above described embodiments, the support 150 is described as coupling with the battery module frame 1 through the fastener receiving hole 151, however, the invention is not limited thereto. In an embodiment, the support 150 and the battery module frame 1 are integrally formed. In this case, compared to a case in which the support 150 is separately manufactured, the integrally formed support 150 and battery module frame 1 are easier to produce, thus save manufacturing cost. An assembly process may be further simplified to thereby reduce a manufacturing time. In addition, since a coupling relationship is simplified, it is possible to enhance durability to external conditions, such as vibrations and abrasion.

Although exemplary embodiments have been shown and described, those of ordinary skill in the art would appreciate that changes may be made in these exemplary embodiments without departing from the principles and spirit of the disclosure, the scope of which is defined by the claims and their equivalents.

What is claimed is:

1. A protection circuit module comprising:
   a substrate;
   a signal receiving connection terminal mounted on the substrate;
   a circuit portion mounted on the substrate, and electrically connected to the signal receiving connection terminal;
   a first cover positioned over a first surface of the substrate and including a circuit portion receiving slot extending through the first cover in a direction orthogonal to a plane defined by the substrate, the circuit portion positioned in the circuit portion receiving slot;
   a second cover positioned over an opposite second surface of the substrate, and into which the substrate is positioned, the second cover including a connection terminal receiving housing having a cell lead guide slot extending through the second cover and the connection terminal receiving housing in the direction orthogonal to the plane defined by the substrate, the signal receiving connection terminal positioned in the connection terminal receiving housing; and
   a support having a surface coupled with the second cover and a fastener receiving hole extending through the support, the support coupled with a battery module frame through the fastener receiving hole.

2. The protection circuit module of claim 1, wherein the circuit portion is a fuse, a relay, a breaker, a switch, or a combination thereof.

3. The protection circuit module of claim 1, wherein the first cover and the second cover are coupled together through complimentary locking mechanisms positioned thereon.

4. The protection circuit module of claim 1, further comprising:
   a fastener that penetrates through the first cover, the substrate, and the second cover to couple the first cover, the substrate, and the second cover together.

5. The protection circuit module of claim 4, wherein the fastener penetrates through an approximate center of the first cover, the first surface and the second surface of the substrate, and the second cover.

6. The protection circuit module of claim 1, where the first cover includes a data connector receiving slot.

7. The protection circuit module of claim 6, further comprising:
   a data connector mounted on the substrate, and positioned in the data connector receiving slot.

8. The protection circuit module of claim 1, further comprising:
   a fastener penetrating through the first cover, the substrate, and the second cover, and guiding the positioning of the second cover on the support.

9. The protection circuit module of claim 1, further comprising:
   a first guide portion positioned on one side of the first cover or the second cover; and
   a corresponding second guide portion positioned on one side of the support, being engaged with the first guide portion when the second cover is coupled to the support.

10. The protection circuit module of claim 1, wherein the second cover is positioned between the first cover and the support.

11. The protection circuit module of claim 10, further comprising:

a fastener coupling the first cover, the substrate, the second cover, and the support together by extending therethrough.

12. The protection circuit module of claim 1, further comprising:
an insulating layer positioned on the support.

13. The protection circuit module of claim 12, wherein an end of a fastener is positioned on the insulating layer.

14. The protection circuit module of claim 9, wherein the fastener receiving hole is positioned on one side of the support opposite the second guide portion.

15. The protection circuit module of claim 1, wherein the support has a connection terminal hole extending through the support in the direction orthogonal to the plane defined by the substrate.

16. The protection circuit module of claim 15, wherein the connection terminal hole is aligned with the cell lead guide slot in the direction orthogonal to the plane defined by the substrate.

17. The protection circuit module of claim 16, wherein the signal receiving connection terminal is coupled with a cell lead of one of a plurality of cells of a battery module having the battery module frame through the cell lead guide slot and the connection terminal hole.

18. The protection circuit module of claim 16, wherein the signal receiving connection terminal is coupled with a sensing module of a battery module having the battery module frame through the cell lead guide slot and the connection terminal hole.

* * * * *